United States Patent
Hsu et al.

(10) Patent No.: US 8,229,386 B1
(45) Date of Patent: Jul. 24, 2012

(54) RECEIVER APPLIED TO A SATELLITE DOWN CONVERTER AND RADIO FREQUENCY METAL-OXIDE-SEMICONDUCTOR AMPLIFIER

(75) Inventors: Kuang-Yu Hsu, Taoyuan County (TW); Chien-Chia Ma, Kaohsiung (TW)

(73) Assignee: AMICCOM Electronics Corporation, Hsinchu Science Park, Hsin-Chu (TW)

( * ) Notice: Subject to any disclaimer, the term of this patent is extended or adjusted under 35 U.S.C. 154(b) by 0 days.

(21) Appl. No.: 13/039,326

(22) Filed: Mar. 3, 2011

(30) Foreign Application Priority Data

Jan. 11, 2011 (TW) .............................. 100101011 A

(51) Int. Cl.
*H04B 1/26* (2006.01)
(52) U.S. Cl. ........ 455/313; 455/314; 455/323; 455/318; 455/12.1; 455/180.1
(58) Field of Classification Search .................. 455/313, 455/314, 318, 323, 12.1, 180.1
See application file for complete search history.

(56) References Cited

U.S. PATENT DOCUMENTS

| 6,246,866 B1 * | 6/2001 | Phang et al. ............... 455/188.2 |
| 8,107,877 B2 * | 1/2012 | Thomas et al. .............. 455/12.1 |
| 2011/0053537 A1 * | 3/2011 | Nagaraj et al. ................ 455/208 |

* cited by examiner

*Primary Examiner* — Sanh Phu
(74) *Attorney, Agent, or Firm* — Winston Hsu; Scott Margo

(57) ABSTRACT

A receiver includes a radio frequency metal-oxide-semiconductor amplifier, a mixer, and an intermediate frequency amplifier. The radio frequency metal-oxide-semiconductor amplifier is used for receiving amplifying a signal of a first band and a signal of a second band of a satellite microwave band from an external antenna circuit according to a control signal. The mixer is coupled to the radio frequency metal-oxide-semiconductor amplifier for reducing the signal of the first band to a signal of a first intermediate frequency band according to a first oscillation frequency of a local oscillator, or reducing the signal of the second band to a signal of a second intermediate frequency band according to a second oscillation frequency of the local oscillator. The intermediate frequency amplifier is coupled to the mixer for amplifying and outputting the signal of the first intermediate frequency band and the signal of the second intermediate frequency band.

12 Claims, 5 Drawing Sheets

RECEIVER APPLIED TO A SATELLITE DOWN CONVERTER AND RADIO FREQUENCY METAL-OXIDE-SEMICONDUCTOR AMPLIFIER

BACKGROUND OF THE INVENTION

1. Field of the Invention

The present invention is related to a receiver applied to a satellite down converter and a radio frequency metal-oxide-semiconductor amplifier, and particularly to a receiver applied to a satellite down converter and a radio frequency metal-oxide-semiconductor amplifier capable of changing a resonant frequency thereof with a usage band.

2. Description of the Prior Art

In the prior art, when a satellite down converter receives a signal of a satellite microwave band (a C band, an X band, a $K_U$ band, or a $K_a$ band), operation range of an amplifier of the satellite down converter has to cover the whole satellite microwave band, that is, the operation range of the amplifier is very large, resulting in difficulty in designing a proper amplifier applicable to the satellite down converter. Please refer to FIG. 1A. FIG. 1A is a diagram illustrating a radio frequency metal-oxide-semiconductor amplifier 100 applied to the satellite down converter according to the prior art. As shown in FIG. 1A, the radio frequency metal-oxide-semiconductor amplifier 100 includes an N-type metal-oxide-semiconductor transistor 102 and an inductor 104. Parasitic capacitors of the inductor 104 and the radio frequency metal-oxide-semiconductor amplifier 100 can determine a fixed resonant frequency $\omega$ of the radio frequency metal-oxide-semiconductor amplifier 100. Please refer to FIG. 1B. FIG. 1B is a diagram illustrating a frequency response of the radio frequency metal-oxide-semiconductor amplifier 100. As shown in FIG. 1B, because operation range of the radio frequency metal-oxide-semiconductor amplifier 100 has to cover the satellite microwave band and maintain proper gain flatness, the radio frequency metal-oxide-semiconductor amplifier 100 has a lower Q value, lower power efficiency, and worse image rejection, resulting in a designer of the satellite down converter facing difficulty in designing the radio frequency metal-oxide-semiconductor amplifier 100 to operate properly over all potential bands.

SUMMARY OF THE INVENTION

An embodiment provides a receiver applied to a satellite down converter. The receiver includes a radio frequency metal-oxide-semiconductor amplifier, a mixer, and an intermediate frequency amplifier. The radio frequency metal-oxide-semiconductor amplifier is used for receiving and amplifying a signal of a first band and a signal of a second band of a satellite microwave band from an external antenna circuit according to a control signal. The mixer is coupled to the radio frequency metal-oxide-semiconductor amplifier for converting the signal of the first band into a signal of a first intermediate frequency band according to a first oscillation frequency of a local oscillator, or converting the signal of the second band into a signal of a second intermediate frequency band according to a second oscillation frequency of the local oscillator. The intermediate frequency amplifier is coupled to the mixer for amplifying and outputting the signal of the first intermediate frequency band and the signal of the second intermediate frequency band.

Another embodiment provides a radio frequency metal-oxide-semiconductor amplifier applied to a receiver of a satellite down converter. The radio frequency metal-oxide-semiconductor amplifier includes a matching circuit, an N-type metal-oxide-semiconductor transistor, a first inductor, a first switch, and a first capacitor. The matching circuit has a first terminal coupled to an external antenna circuit, a second terminal, and a third terminal coupled to ground, wherein the matching circuit is used for matching the radio frequency metal-oxide-semiconductor amplifier and the external antenna circuit, and for receiving a signal of a first band of a satellite microwave band and a signal of a second band of the satellite microwave band. The N-type metal-oxide-semiconductor transistor has a first terminal, a second terminal coupled to the matching circuit, and a third terminal coupled to the ground, wherein the N-type metal-oxide-semiconductor transistor is used for amplifying the signal of the first band and the signal of the second band. The first inductor has a first terminal for receiving a first voltage, and a second terminal coupled to the first terminal of the N-type metal-oxide-semiconductor transistor. The first switch has a first terminal coupled to the second terminal of the first inductor, a second terminal for receiving the control signal, and a third terminal. The first capacitor has a first terminal coupled to the third terminal of the first switch, and a second terminal coupled to the ground. When the first switch is turned on according to the control signal, the matching circuit receives the signal of the first band according to a resonant frequency of the first inductor and the first capacitor, and when the first switch is turned off according to the control signal, the matching circuit receives the signal of the second band according to a resonant frequency of the first inductor and a parasitic capacitor.

The present invention provides a receiver applied to a satellite down converter and a radio frequency metal-oxide-semiconductor amplifier. The receiver and the radio frequency metal-oxide-semiconductor amplifier adjust a resonant frequency of the radio frequency metal-oxide-semiconductor amplifier to a first resonant frequency and a second resonant frequency according to a control signal. When the resonant frequency of the radio frequency metal-oxide-semiconductor amplifier is the first resonant frequency, the radio frequency metal-oxide-semiconductor amplifier receives and amplifies a signal of a first band of a satellite microwave band; when the resonant frequency of the radio frequency metal-oxide-semiconductor amplifier is the second resonant frequency, the radio frequency metal-oxide-semiconductor amplifier receives and amplifies a signal of a second band of the satellite microwave band. Thus, the receiver and the radio frequency metal-oxide-semiconductor amplifier do not cover the whole satellite microwave band simultaneously. Therefore, compared to the prior art, the present invention has a higher Q value, higher power efficiency, higher gain flatness, and better image rejection.

These and other objectives of the present invention will no doubt become obvious to those of ordinary skill in the art after reading the following detailed description of the preferred embodiment that is illustrated in the various figures and drawings.

DETAILED DESCRIPTION

Figure 1A:
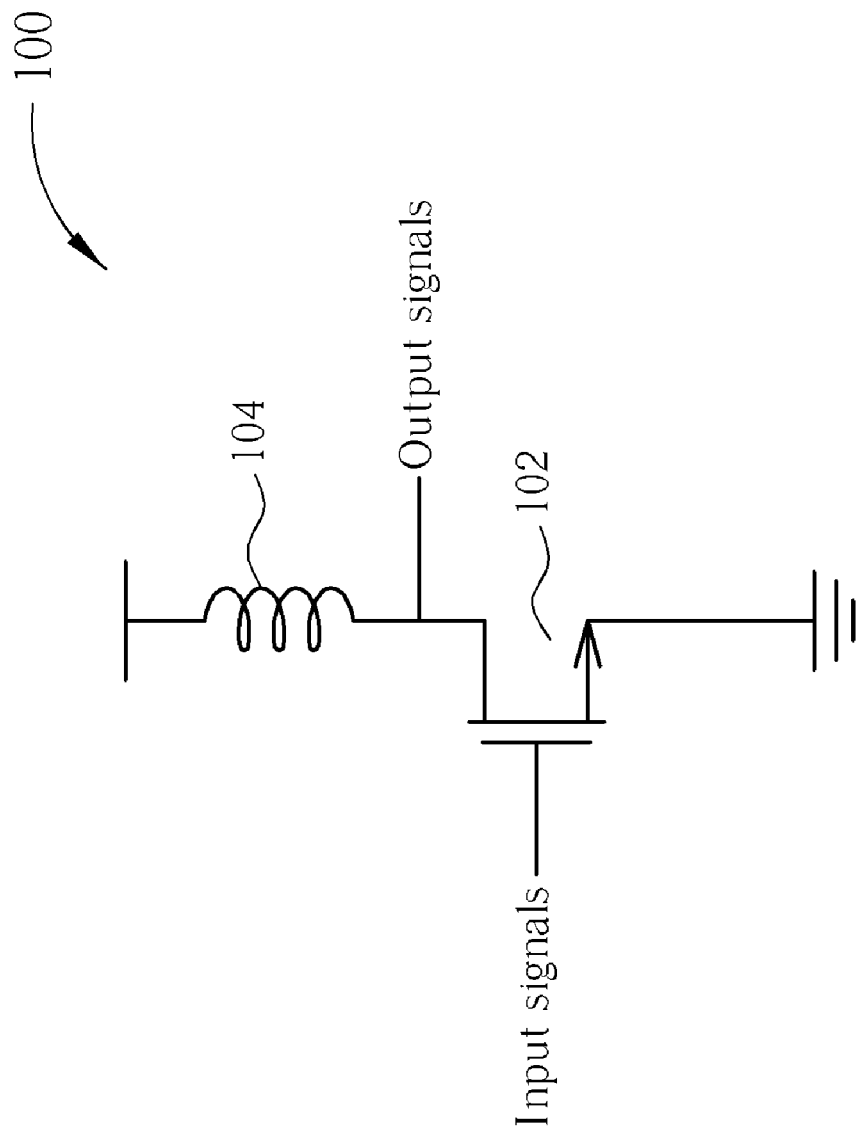
FIG. 1A is a diagram illustrating a radio frequency metal-oxide-semiconductor amplifier applied to the satellite down converter according to the prior art.
Figure 1B:
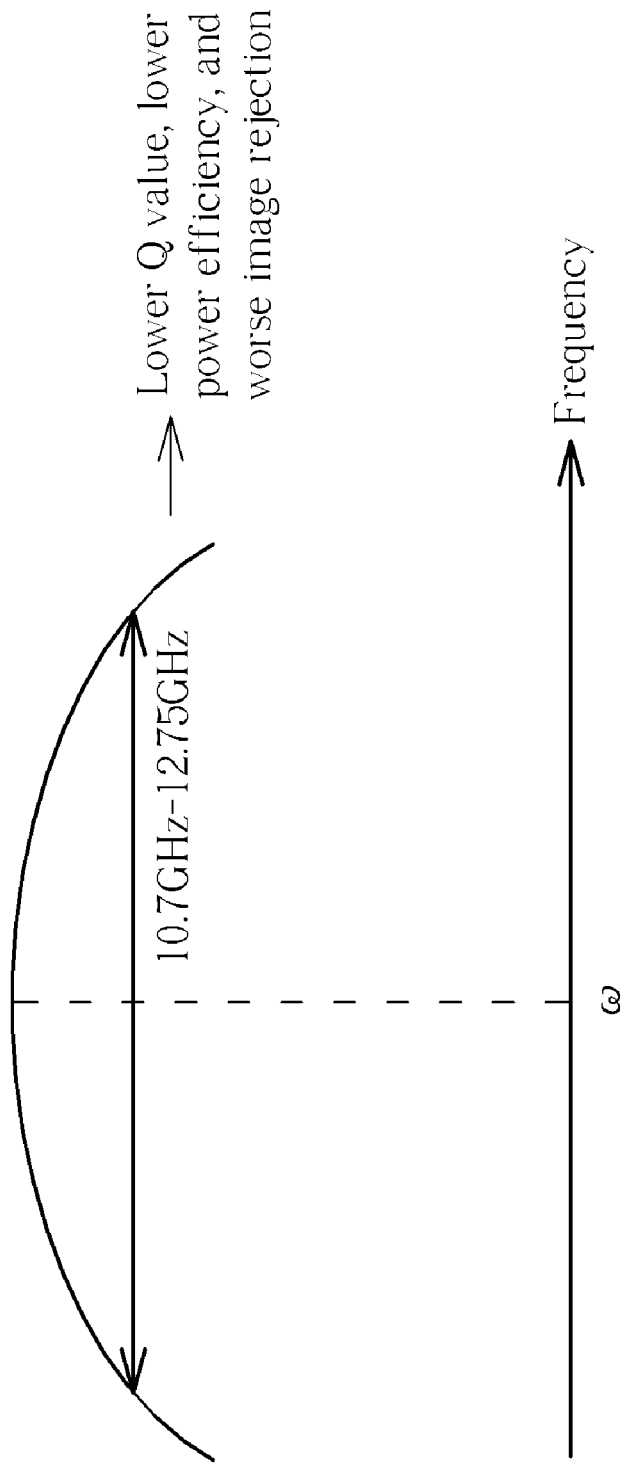
FIG. 1B is a diagram illustrating a frequency response of the radio frequency metal-oxide-semiconductor amplifier.
Figure 2:
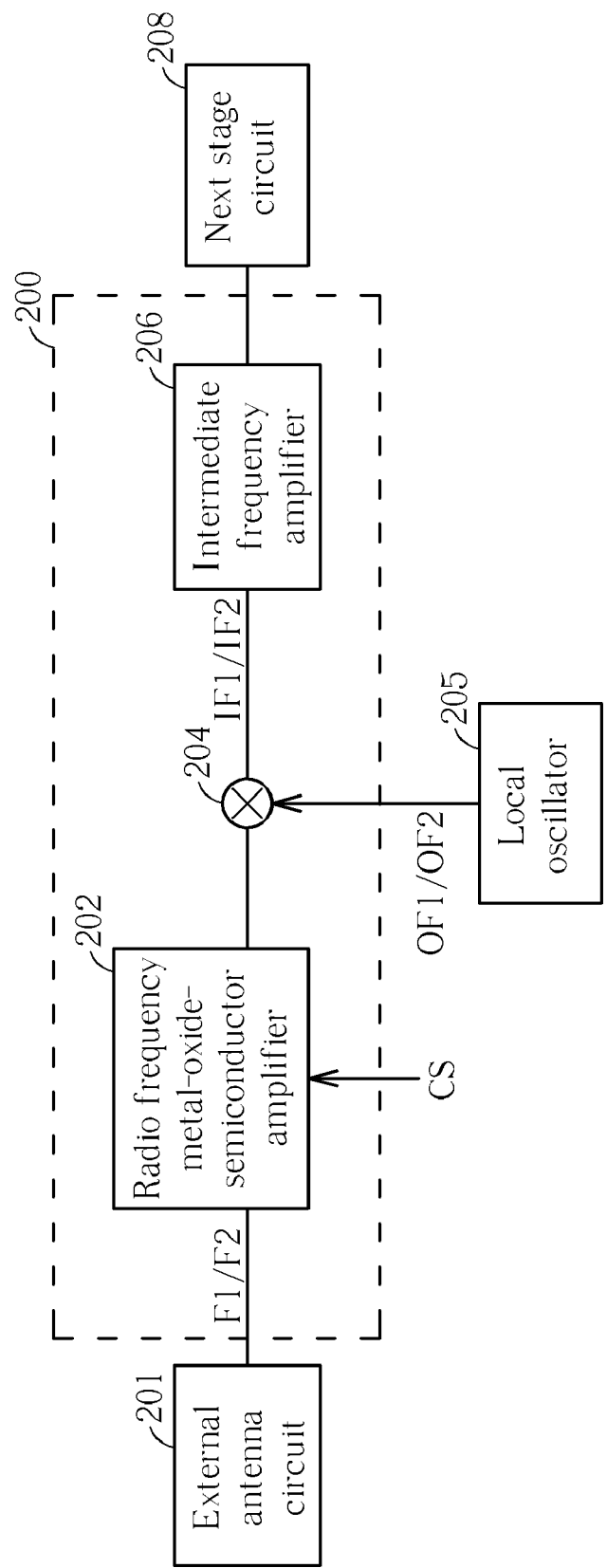
FIG. 2 is a diagram illustrating a receiver applied to a satellite down converter according to an embodiment.

Please refer to FIG. 2. FIG. 2 is a diagram illustrating a receiver 200 applied to a satellite down converter according to an embodiment. The receiver 200 is coupled to an external antenna circuit 201. The receiver 200 includes a radio frequency metal-oxide-semiconductor amplifier 202, a mixer 204, and an intermediate frequency amplifier 206. The radio frequency metal-oxide-semiconductor amplifier 202 is used for receiving and amplifying a signal F1 of a first band and a signal F2 of a second band of a satellite microwave band from the external antenna circuit 201 according to a control signal CS, where the satellite microwave band is a C band, an X band, a $K_U$ band, or a $K_a$ band. Taking the $K_U$ band as an example, the $K_U$ band is between 10.7 GHz and 12.75 GHz, a first band of the $K_U$ band is between 10.7 GHz and 11.7 GHz, and a second band of the $K_U$ band is between 11.7 GHz and 12.75 GHz. The mixer 204 is coupled to the radio frequency metal-oxide-semiconductor amplifier 202 for converting the signal F1 of the first band into a signal IF1 in a first intermediate frequency band according to a first oscillation frequency OF1 of a local oscillator 205, or converting the signal F2 of the second band into a signal IF2 in a second intermediate frequency band according to a second oscillation frequency OF2 of the local oscillator 205. Taking the $K_U$ band as an example, the first oscillation frequency OF1 is 9.75 GHz and the second oscillation frequency OF2 is 10.6 GHz. The intermediate frequency amplifier 206 is coupled to the mixer 204 for amplifying and outputting the signal IF1 in the first intermediate frequency band and the signal IF2 in the second intermediate frequency band to a next stage circuit 208. Take the $K_U$ band for example, the first intermediate frequency band is between 950 MHz and 1950 MHz, and the second intermediate frequency band is between 1100 MHz and 2150 MHz.

Figure 3:
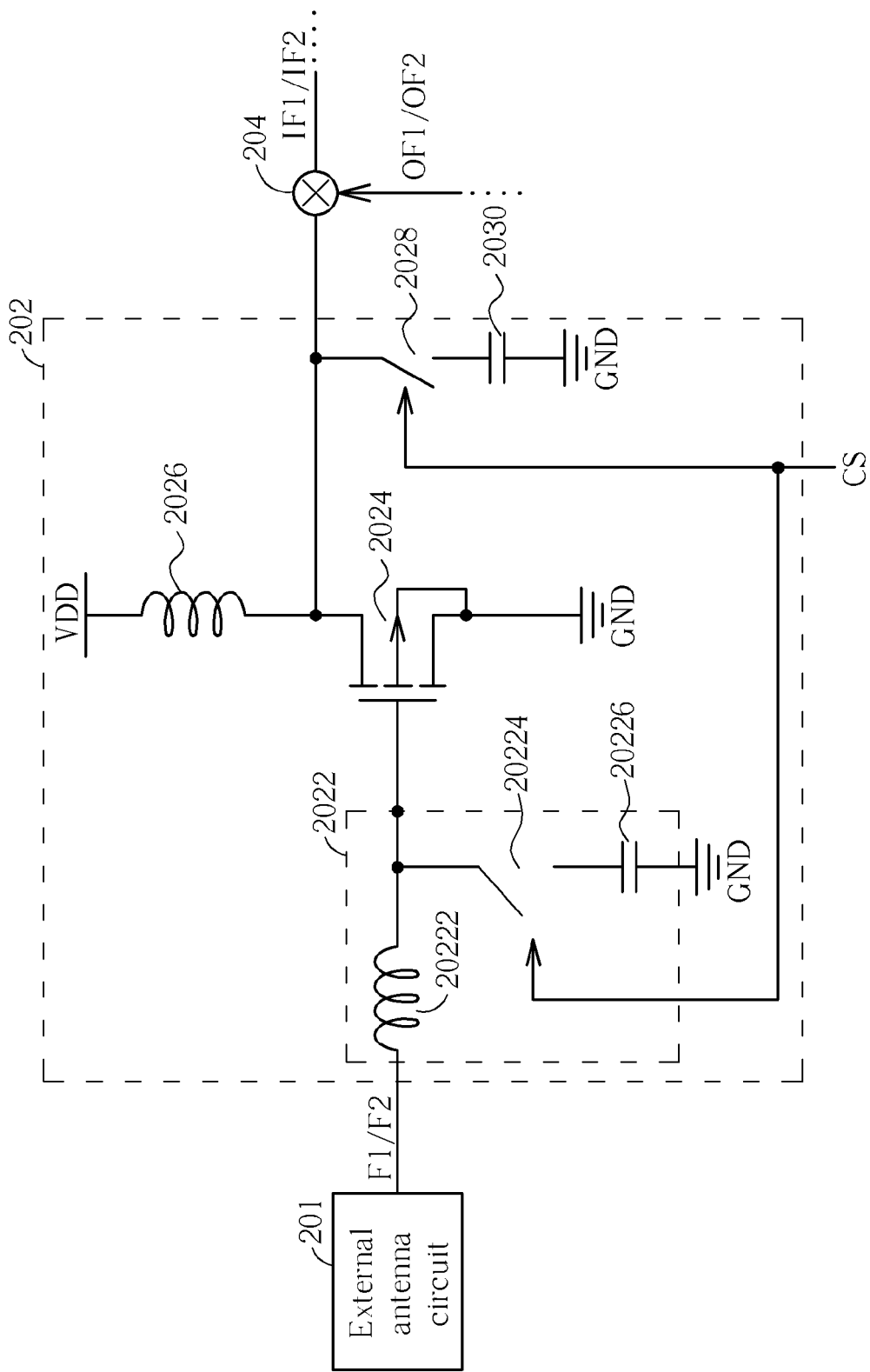
FIG. 3 is a diagram illustrating a radio frequency metal-oxide-semiconductor amplifier 202 according to another embodiment.

Please refer to FIG. 3. FIG. 3 is a diagram illustrating a radio frequency metal-oxide-semiconductor amplifier 202 according to another embodiment. The radio frequency metal-oxide-semiconductor amplifier 202 includes a matching circuit 2022, an N-type metal-oxide-semiconductor transistor 2024, a first inductor 2026, a first switch 2028, and a first capacitor 2030. The matching circuit 2022 has a first terminal coupled to an external antenna circuit 201, a second terminal, and a third terminal coupled to ground GND, where the matching circuit 2022 is used for matching the radio frequency metal-oxide-semiconductor amplifier 202 and the external antenna circuit 201, and for receiving the signal F1 of the first band and the signal F2 of the second band. The N-type metal-oxide-semiconductor transistor 2024 has a first terminal, a second terminal coupled to the matching circuit 2022, and a third terminal coupled to the ground GND, where the N-type metal-oxide-semiconductor transistor 2024 is used for amplifying the signal F1 of the first band and the signal F2 of the second band. The first inductor 2026 has a first terminal for receiving a first voltage VDD, and a second terminal coupled to the first terminal of the N-type metal-oxide-semiconductor transistor 2024. The first switch 2028 has a first terminal coupled to the second terminal of the first inductor 2026, a second terminal for receiving the control signal CS, and a third terminal. The first capacitor 2030 has a first terminal coupled to the third terminal of the first switch 2028, and a second terminal coupled to the ground GND. The matching circuit 2022 includes a second inductor 20222, a second switch 20224, and a second capacitor 20226. The second inductor 20222 has a first terminal coupled to the first terminal of the matching circuit 202, and a second terminal coupled to the second terminal of the matching circuit 2022. The second switch 20224 has a first terminal coupled to the second terminal of the second inductor 20222, a second terminal for receiving the control signal CS, and a third terminal. The second capacitor 20226 has a first terminal coupled to the third terminal of the second switch 20224, and a second terminal coupled to the ground GND.

When the first switch 2028 and the second switch 20224 are turned on according to the control signal CS, the matching circuit 2022 receives the signal F1 of the first band according to a first resonant frequency ω1 of the first inductor 2026 and the first capacitor 2030, and when the first switch 2028 and the second switch 20224 are turned off according to the control signal CS, the matching circuit 2022 receives the signal F2 of the second band according to a second resonant frequency ω2 of the first inductor 2026 and parasitic capacitors of the radio frequency metal-oxide-semiconductor amplifier 202. In addition, when the matching circuit 2022 receives the signal F1 of the first band according to the first resonant frequency ω1, the matching circuit 2022 utilizes the second inductor 20222 parallel to the second capacitor 20226 to match the external antenna circuit 201; when the matching circuit 2022 receives the signal F2 of the second band according to the second resonant frequency ω2, the matching circuit 2022 utilizes the second inductor 20222 to match the external antenna circuit 201.

Figure 4:
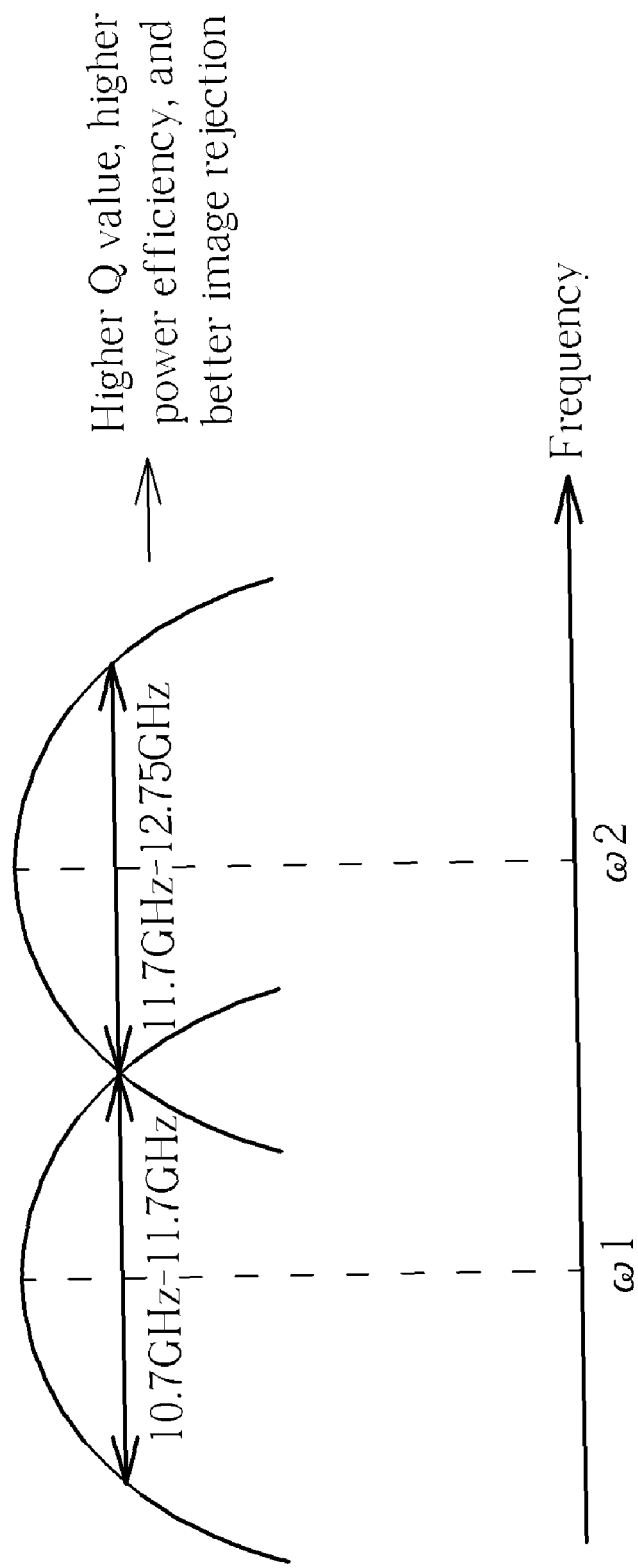
FIG. 4 is a diagram illustrating frequency responses of the radio frequency metal-oxide-semiconductor amplifier.

Please refer to FIG. 4. FIG. 4 is a diagram utilizing the $K_U$ band to illustrate frequency responses of the radio frequency metal-oxide-semiconductor amplifier 202. As shown in FIG. 4, the radio frequency metal-oxide-semiconductor amplifier 202 has a first frequency response FFR covering the first band of the $K_U$ band and a second frequency response SFR covering the second band of the $K_U$ band according to the control signal CS, where the first frequency response FFR corresponds to the first resonant frequency ω1 and the second frequency response SFR corresponds to the second resonant frequency ω2. As shown in FIG. 4, because operation range of the radio frequency metal-oxide-semiconductor amplifier 202 is divided into the first band (10.7 GHz-11.7 GHz) and the second band (11.7 GHz-12.75 GHz) according to the control signal CS, that is the operation range of the radio frequency metal-oxide-semiconductor amplifier 202 does not cover the whole $K_U$ band simultaneously according to the control signal CS, the radio frequency metal-oxide-semiconductor amplifier 202 has a higher Q value, higher power efficiency, higher gain flatness, and better image rejection.

To sum up, the receiver applied to the satellite down converter and the radio frequency metal-oxide-semiconductor amplifier adjust the resonant frequency of the radio frequency metal-oxide-semiconductor amplifier to the first resonant frequency and the second resonant frequency according to the control signal. When the resonant frequency of the radio frequency metal-oxide-semiconductor amplifier is the first resonant frequency, the radio frequency metal-oxide-semiconductor amplifier receives and amplifies the signal of the first band of the satellite microwave band; when the resonant frequency of the radio frequency metal-oxide-semiconductor amplifier is the second resonant frequency, the radio frequency metal-oxide-semiconductor amplifier receives and amplifies the signal of the second band of the satellite microwave band. Thus, the receiver applied to the satellite down converter and the radio frequency metal-oxide-semiconductor amplifier do not cover the whole satellite microwave band simultaneously. Therefore, compared to the prior art, the present invention has a higher Q value, higher power efficiency, higher gain flatness, and better image rejection.

Those skilled in the art will readily observe that numerous modifications and alterations of the device and method may be made while retaining the teachings of the invention.

What is claimed is:

1. A receiver applied to a satellite down converter, the receiver comprising:
   a radio frequency metal-oxide-semiconductor amplifier for receiving and amplifying a signal of a first band and a signal of a second band of a satellite microwave band from an external antenna circuit according to a control signal, the radio frequency metal-oxide-semiconductor amplifier comprising:
      a matching circuit having a first terminal coupled to the external antenna circuit, a second terminal, and a third terminal coupled to ground, wherein the matching circuit is used for matching the radio frequency metal-oxide-semiconductor amplifier and the external antenna circuit, and for receiving the signal of the first band and the signal of the second band;
      an N-type metal-oxide-semiconductor transistor having a first terminal, a second terminal coupled to the matching circuit, and a third terminal coupled to the ground, wherein the N-type metal-oxide-semiconductor transistor is used for amplifying the signal of the first band and the signal of the second band;
      a first inductor having a first terminal for receiving a first voltage, and a second terminal coupled to the first terminal of the N-type metal-oxide-semiconductor transistor;
      a first switch having a first terminal coupled to the second terminal of the first inductor, a second terminal for receiving the control signal, and a third terminal; and
      a first capacitor having a first terminal coupled to the third terminal of the first switch, and a second terminal coupled to the ground;
      wherein when the first switch is turned on according to the control signal, the matching circuit receives the signal of the first band according to a resonant frequency of the first inductor and the first capacitor, and when the first switch is turned off according to the control signal, the matching circuit receives the signal of the second band according to a resonant frequency of the first inductor and a parasitic capacitor;
   a mixer coupled to the radio frequency metal-oxide-semiconductor amplifier for converting the signal of the first band into a signal of a first intermediate frequency band according to a first oscillation frequency of a local oscillator, or converting the signal of the second band into a signal of a second intermediate frequency band according to a second oscillation frequency of the local oscillator; and
   an intermediate frequency amplifier coupled to the mixer for amplifying and outputting the signal of the first intermediate frequency band and the signal of the second intermediate frequency band.

2. The receiver of claim 1, wherein the matching circuit comprises:
   a second inductor having a first terminal coupled to the first terminal of the matching circuit, and a second terminal coupled to the second terminal of the matching circuit;
   a second switch having a first terminal coupled to the second terminal of the second inductor, a second terminal for receiving the control signal, and a third terminal; and
   a second capacitor having a first terminal coupled to the third terminal of the second switch, and a second terminal coupled to the ground.

3. The receiver of claim 1, wherein the satellite microwave band is a C band.

4. The receiver of claim 1, wherein the satellite microwave band is an X band.

5. The receiver of claim 1, wherein the satellite microwave band is a $K_U$ band.

6. The receiver of claim 1, wherein the satellite microwave band is a $K_a$ band.

7. A radio frequency metal-oxide-semiconductor amplifier applied to a receiver of a satellite down converter, the radio frequency metal-oxide-semiconductor amplifier comprising:
   a matching circuit having a first terminal coupled to an external antenna circuit, a second terminal, and a third terminal coupled to ground, wherein the matching circuit is used for matching the radio frequency metal-oxide-semiconductor amplifier and the external antenna circuit, and for receiving a signal of a first band of a satellite microwave band and a signal of a second band of the satellite microwave band;
   an N-type metal-oxide-semiconductor transistor having a first terminal, a second terminal coupled to the matching circuit, and a third terminal coupled to the ground, wherein the N-type metal-oxide-semiconductor transistor is used for amplifying the signal of the first band and the signal of the second band;
   a first inductor having a first terminal for receiving a first voltage, and a second terminal coupled to the first terminal of the N-type metal-oxide-semiconductor transistor;
   a first switch having a first terminal coupled to the second terminal of the first inductor, a second terminal for receiving the control signal, and a third terminal; and
   a first capacitor having a first terminal coupled to the third terminal of the first switch, and a second terminal coupled to the ground;
   wherein when the first switch is turned on according to the control signal, the matching circuit receives the signal of the first band according to a resonant frequency of the first inductor and the first capacitor, and when the first switch is turned off according to the control signal, the matching circuit receives the signal of the second band according to a resonant frequency of the first inductor and a parasitic capacitor.

8. The radio frequency metal-oxide-semiconductor amplifier of claim 7, wherein the matching circuit comprises:
   a second inductor having a first terminal coupled to the first terminal of the matching circuit, and a second terminal coupled to the second terminal of the matching circuit;
   a second switch having a first terminal coupled to the second terminal of the second inductor, a second terminal for receiving the control signal, and a third terminal; and
   a second capacitor having a first terminal coupled to the third terminal of the second switch, and a second terminal coupled to the ground.

9. The radio frequency metal-oxide-semiconductor amplifier of claim 7, wherein the satellite microwave band is a C band.

10. The radio frequency metal-oxide-semiconductor amplifier of claim 7, wherein the satellite microwave band is an X band.

11. The radio frequency metal-oxide-semiconductor amplifier of claim 7, wherein the satellite microwave band is a $K_U$ band.

12. The radio frequency metal-oxide-semiconductor amplifier of claim 7, wherein the satellite microwave band is a Ka band.

* * * * *